United States Patent
Lee

(10) Patent No.: US 10,340,012 B2
(45) Date of Patent: Jul. 2, 2019

(54) CONTROL LOGIC, SEMICONDUCTOR MEMORY DEVICE, AND METHOD OF OPERATING THE SAME

(71) Applicant: SK hynix Inc., Icheon-si Gyeonggi-do (KR)

(72) Inventor: Jung Hwan Lee, Suwon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/648,639

(22) Filed: Jul. 13, 2017

(65) Prior Publication Data

US 2018/0158528 A1 Jun. 7, 2018

(30) Foreign Application Priority Data

Dec. 7, 2016 (KR) .................. 10-2016-0165858

(51) Int. Cl.
| | |
|---|---|
| G11C 16/10 | (2006.01) |
| G11C 16/18 | (2006.01) |
| G11C 16/26 | (2006.01) |
| G11C 11/56 | (2006.01) |
| G11C 16/04 | (2006.01) |
| G11C 16/34 | (2006.01) |

(52) U.S. Cl.
CPC .......... *G11C 16/10* (2013.01); *G11C 11/5671* (2013.01); *G11C 16/18* (2013.01); *G11C 16/26* (2013.01); *G11C 16/0483* (2013.01); *G11C 16/3459* (2013.01); *G11C 2211/562* (2013.01); *G11C 2211/5621* (2013.01); *G11C 2211/5625* (2013.01)

(58) Field of Classification Search
CPC ......... G11C 16/10; G11C 16/18; G11C 16/26; G11C 16/0483
See application file for complete search history.

(56) References Cited

U.S. PATENT DOCUMENTS

2009/0168511 A1* 7/2009 Kang ............... G11C 16/0483
365/185.2
2015/0016189 A1* 1/2015 Son ..................... G11C 16/26
365/185.11

FOREIGN PATENT DOCUMENTS

| KR | 1020060108324 A | 10/2006 |
|---|---|---|
| KR | 1020120113553 A | 10/2012 |
| KR | 101468097 B1 | 12/2014 |

* cited by examiner

*Primary Examiner* — Mohammed A Bashar
(74) *Attorney, Agent, or Firm* — William Park & Associates Ltd.

(57) ABSTRACT

Provided herein may be a control logic, semiconductor memory device, method of operating the control logic, and or method of operating the semiconductor memory device. The semiconductor memory device may include a control logic. The control logic may be configured to control a program voltage to be applied to the selected word line. The control logic may be configured to control a pass voltage to be applied to an unselected word line.

20 Claims, 16 Drawing Sheets

CONTROL LOGIC, SEMICONDUCTOR MEMORY DEVICE, AND METHOD OF OPERATING THE SAME

CROSS-REFERENCE TO RELATED APPLICATION

The present application claims priority under 35 U.S.C. § 119(a) to Korean patent application number 10-2016-0165858 filed on Dec. 7, 2016 in the Korean Intellectual Property Office, the entire disclosure of which is incorporated herein by reference.

BACKGROUND

1. Technical Field

Various embodiments of the present disclosure may generally relate to an electronic device, and more particularly, to a semiconductor memory device, control logic and a method of operating the semiconductor memory device and or control logic.

2. Related Art

Semiconductor memory devices are memory devices realized by using a semiconductor such as silicon (Si), germanium (Ge), gallium arsenide (GaAs), indium phosphide (InP), or the like. Semiconductor memory devices are classified into volatile memory devices and nonvolatile memory devices.

The volatile memory device is a memory device in which data stored therein is lost when power is turned off. Representative examples of the volatile memory device include a static RAM (SRAM), a dynamic RAM (DRAM), a synchronous DRAM (SDRAM), etc. The nonvolatile memory device is a memory device in which data stored therein is maintained even when power is turned off. Representative examples of the nonvolatile memory device include a read-only memory (ROM), a programmable ROM (PROM), an electrically programmable ROM (EPROM), an electrically erasable programmable ROM (EEPROM), a flash memory, a phase-change random access memory (PRAM), a magnetic RAM (MRAM), a resistive RAM (RRAM), a ferroelectric RAM (FRAM), etc. The flash memory is classified into a NOR type memory and a NAND type memory.

SUMMARY

An embodiment of the present disclosure may provide for a semiconductor memory device. An embodiment of the present disclosure may provide for a control logic. An embodiment of the present disclosure may provide for a method of operating a semiconductor memory device. An embodiment of the present disclosure may provide for a method of operating a control logic. The semiconductor memory device may include a control logic. The control logic may be configured to control a program voltage to be applied to the selected word line. The control logic may be configured to control a pass voltage to be applied to an unselected word line.

DETAILED DESCRIPTION

Figure 1:
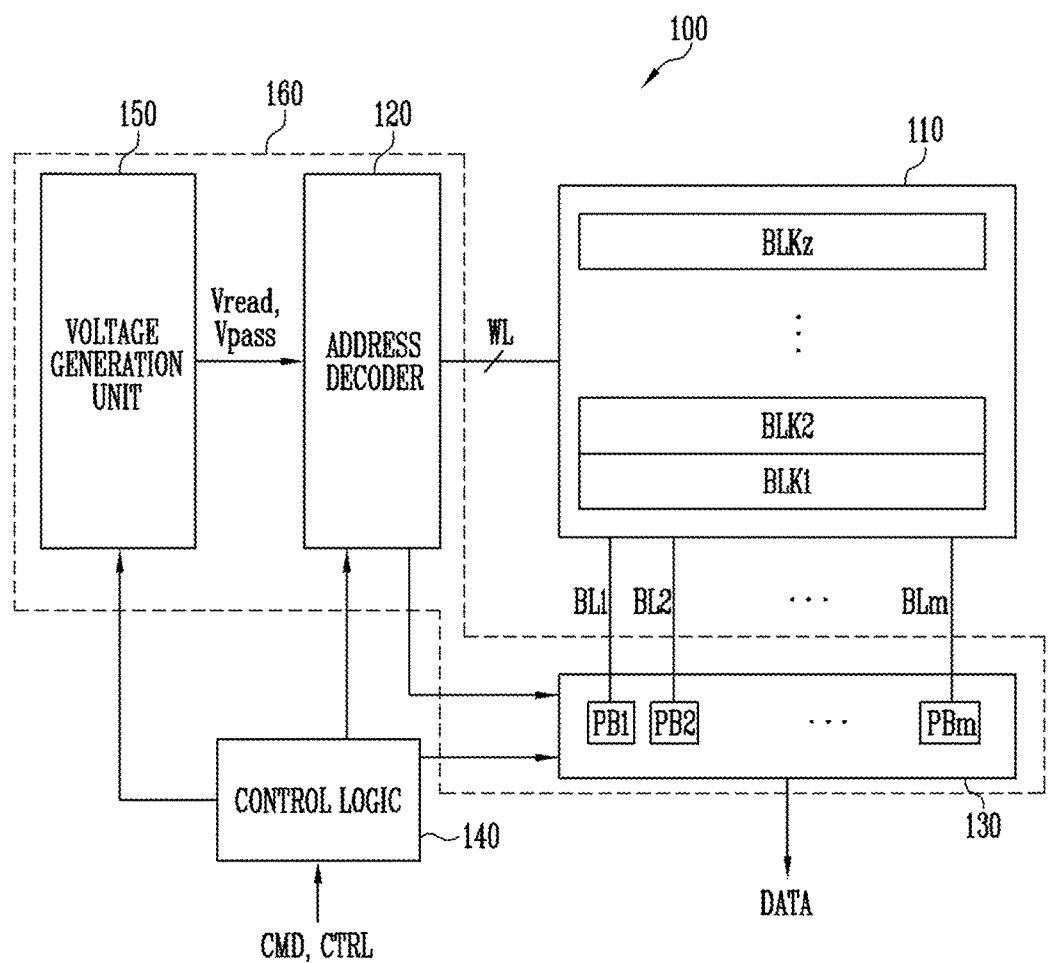
FIG. 1 is a block diagram illustrating a semiconductor memory device in accordance with an embodiment of the present disclosure.

Examples of embodiments will now be described hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the examples of embodiments to those skilled in the art.

In the drawing figures, dimensions may be exaggerated for clarity of illustration. It will be understood that when an element is referred to as being "between" two elements, it can be the only element between the two elements, or one or more intervening elements may also be present.

Hereinafter, embodiments will be described with reference to the accompanying drawings. Embodiments are described herein with reference to cross-sectional illustrations that are schematic illustrations of embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but may include deviations in shapes that result, for example, from manufacturing. In the drawings, lengths and sizes of layers and regions may be exaggerated for clarity. Like reference numerals in the drawings denote like elements.

Terms such as 'first' and 'second' may be used to describe various components, but they should not limit the various components. Those terms are only used for the purpose of differentiating a component from other components. For example, a first component may be referred to as a second component, and a second component may be referred to as a first component and so forth without departing from the spirit and scope of the present disclosure. Furthermore, 'and/or' may include any one of or a combination of the components mentioned.

Furthermore, a singular form may include a plural from as long as it is not specifically mentioned in a sentence. Furthermore, "include/comprise" or "including/comprising" used in the specification represents that one or more components, steps, operations, and elements exist or are added.

Furthermore, unless defined otherwise, all the terms used in this specification including technical and scientific terms have the same meanings as would be generally understood by those skilled in the related art. The terms defined in generally used dictionaries should be construed as having the same meanings as would be construed in the context of the related art, and unless clearly defined otherwise in this specification, should not be construed as having idealistic or overly formal meanings.

It is also noted that in this specification, "connected/coupled" refers to one component not only directly coupling another component but also indirectly coupling another component through an intermediate component. On the other hand, "directly connected/directly coupled" refers to one component directly coupling another component without an intermediate component.

Various embodiments of the present disclosure may be directed to a semiconductor memory device having improved program operating characteristics.

Various embodiments of the present disclosure may be directed to a method of operating a semiconductor memory device having improved program operating characteristics.

FIG. 1 is a block diagram illustrating a semiconductor memory device in accordance with an embodiment of the present disclosure.

Referring to FIG. 1, a semiconductor memory device 100 includes a memory cell array 110, an address decoder 120, a read and write (read/write) circuit 130, a control logic 140, and a voltage generation unit 150.

The memory cell array 110 includes a plurality of memory blocks BLK1 to BLKz. The memory blocks BLK1 to BLKz are coupled to the address decoder 120 through word lines WL. The memory blocks BLK1 to BLKz are coupled to the read/write circuit 130 through bit lines BL1 to BLm. Each of the memory blocks BLK1 to BLKz includes a plurality of memory cells. In an embodiment, the plurality of memory cells may be nonvolatile memory cells and be configured with nonvolatile memory cells having a vertical channel structure. The memory cell array 110 may be formed of a memory cell array having a two-dimensional structure. In an embodiment, the memory cell array 110 may be formed of a memory cell array having a three-dimensional structure. In an embodiment of the present disclosure, each of the memory blocks BLK1 to BLKz included in the memory cell array 110 may include a plurality of sub-blocks. For example, each of the memory blocks BLK1 to BLKz may include two sub-blocks. In another example, each of the memory blocks BLK1 to BLKz may include four sub-blocks. According to the semiconductor memory device and a method of operating the same in accordance with an embodiment of the present disclosure, the number of sub-blocks included in each memory block is not limited to this, and various numbers of sub-blocks may be included in each memory block. Each of the memory cells included in the memory cell array may store at least one bit of data. In an embodiment, each of the memory cells included in the memory cell array 110 may be a single-level cell (SLC), which stores 1-bit data. In an embodiment, each of the memory cells included in the memory cell array 110 may be a multi-level cell (MLC), which stores 2-bit data. In an embodiment, each of the memory cells included in the memory cell array 110 may be a triple-level cell, which stores 3-bit data. In an embodiment, each of the memory cells included in the memory cell array 110 may be a quad-level cell, which stores 4-bit data. In various embodiments, the memory cell array 110 may include a plurality of memory cells each of which stores 5 or more bits of data.

The address decoder 120, the read/write circuit 130, and the voltage generation unit 150 function as a peripheral circuit for driving the memory cell array 110. The address decoder 120 is coupled to the memory cell array 110 through the word lines WL. The address decoder 120 may operate in response to control of the control logic 140. The address decoder 120 may receive addresses through an input and output (input/output) buffer (not illustrated) provided in the semiconductor memory device 100.

The address decoder 120 may decode a block address among the received addresses. The address decoder 120 selects at least one memory block based on the decoded block address. When a read voltage application operation is performed during a read operation, the address decoder 120 may apply a read voltage Vread generated from the voltage generation unit 150, to a selected word line of a selected memory block and apply a pass voltage Vpass to the other unselected word lines. During a program verify operation, the address decoder 120 may apply a verify voltage generated from the voltage generation unit 150, to a selected word line of a selected memory block, and apply a pass voltage Vpass to the other unselected word lines.

The address decoder 120 may decode a column address among the received addresses. The address decoder 120 may transmit the decoded column address to the read/write circuit 130.

The read or program operation of the semiconductor memory device 100 is performed on a page basis. Addresses received in a request for a read or program operation may include a block address, a row address and a column address. The address decoder 120 may select one memory block and one word line in accordance with a block address and a row address. The column address may be decoded by the address decoder 120 and provided to the read/write circuit 130.

The address decoder 120 may include a block decoder, a row decoder, a column decoder, an address buffer, etc.

The read/write circuit 130 includes a plurality of page buffers PB1 to PBm. The read/write circuit 130 may be operated as a read circuit during a read operation of the memory cell array 110 and as a write circuit during a write operation. The plurality of page buffers PB1 to PBm are coupled to the memory cell array 110 through the bit lines BL1 to BLm. During a read or program verify operation, to sense threshold voltages of the memory cells, the page buffers PB1 to PBm may continuously supply sensing current to the bit lines coupled to the memory cells, and each page buffer may sense, through a sensing node, a change in the amount of current flowing depending on a program state of a corresponding memory cell and latch it as sensing data.

The read/write circuit 130 is operated in response to page buffer control signals outputted from the control logic 140.

During a read operation, the read/write circuit 130 may sense data of the memory cells and temporarily store read-out data, and then output data DATA to the input/output buffer (not illustrated) of the semiconductor memory device 100. In an embodiment, the read/write circuit 130 may include a column select circuit or the like as well as the page buffers (or page resistors).

The control logic 140 is coupled to the address decoder 120, the read/write circuit 130, and the voltage generation unit 150. The control logic 140 may receive a command CMD and a control signal CTRL through the input/output buffer (not illustrated) of the semiconductor memory device 100. The control logic 140 may control the overall operation of the semiconductor memory device 100 in response to the control signal CTRL. The control logic 140 may output a control signal for controlling the sensing node precharge potential levels of the plurality of page buffers PB1 to PBm. The control logic 140 may control the read/write circuit 130 to perform a read operation of the memory cell array 110.

The voltage generator 150 generates a read voltage Vread and a pass voltage Vpass during a read operation in response to a voltage generation unit control signal outputted from the control logic 140.

In the semiconductor memory device and the method of operating the same in accordance with an embodiment of the present disclosure, the control logic 140 may determine a program voltage based on a position of a selected word line in a cell string. The control logic 140 may also determine a program pass voltage based on a program step voltage forming the program voltage. Therefore, depending on the position of the selected word line, the program voltage and the program pass voltage may be flexibly determined, whereby the performance of the semiconductor memory device may be enhanced.

Figure 2:
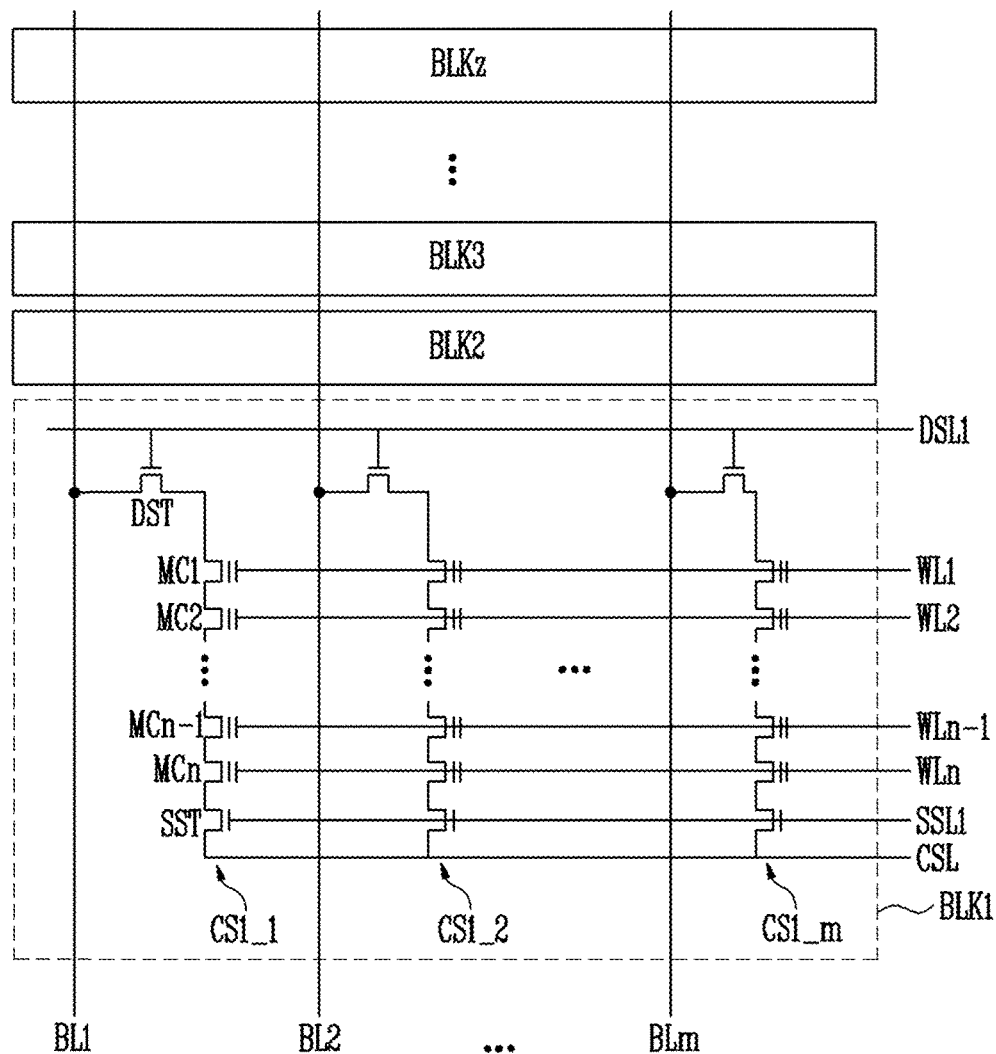
FIG. 2 is a diagram illustrating an embodiment of the memory cell array of FIG. 1.

FIG. 2 is a diagram illustrating an embodiment of a memory cell array 110_1 of the memory cell array 110 of FIG. 1.

Referring to FIG. 2, first to z-th memory blocks BLK1 to BLKz included in the memory cell array 110_1 are coupled in common to first to m-th bit lines BL1 to BLm. In FIG. 2, for the sake of explanation, elements of only the first memory block BLK1 among the plurality of memory blocks BLK1 to BLKz are illustrated, and illustration of elements of each of the other memory blocks BLK2 to BLKz is omitted. It will be understood that each of the memory blocks BLK2 to BLKz has the same configuration as that of the first memory block BLK1.

The memory block BLK1 includes a plurality of cell strings CS1_1 to CS1_m. The first to m-th cell strings CS1_1 to CS1_m are respectively coupled to the first to m-th bit lines BL1 to BLm.

Each of the first to m-th cell strings CS1_1 to CS1_m includes a drain select transistor DST, a plurality of memory cells MC1 to MCn which are coupled in series to each other, and a source select transistor SST. The drain select transistor DST is coupled to a drain select line DSL1. The first to n-th memory cells MC1 to MCn are respectively coupled to first to n-th word lines WL1 to WLn. The source select transistor SST is coupled to a source select line SSL1. A drain of the drain select transistor DST is coupled to the corresponding bit line. The drain select transistors DST of the first to m-th cell strings CS1_1 to CS1_m are respectively coupled to the first to m-th bit lines BL1 to BLm. A source of the source select transistor SST is coupled to a common source line CSL. In an embodiment, the common source line CSL may be coupled in common to the first to z-th memory blocks BLK1 to BLKz.

The drain select line DSL1, the first to n-th word lines WL1 to WLn, and the source select line SSL1 are controlled by the address decoder 120. The common source line CSL is controlled by the control logic 140. The first to m-th bit lines BL1 to BLm are controlled by the read/write circuit 123.

Referring to FIG. 1, in an embodiment, for example, a peripheral circuit 160 may include a voltage generation unit 150, an address decoder 120, and a read/write circuit 130. The peripheral circuit 160 drives the memory cell array 110. For example, the peripheral circuit 160 may drive the memory cell array 110 so that a program operation, a read operation, and an erase operation are performed.

Figure 3:
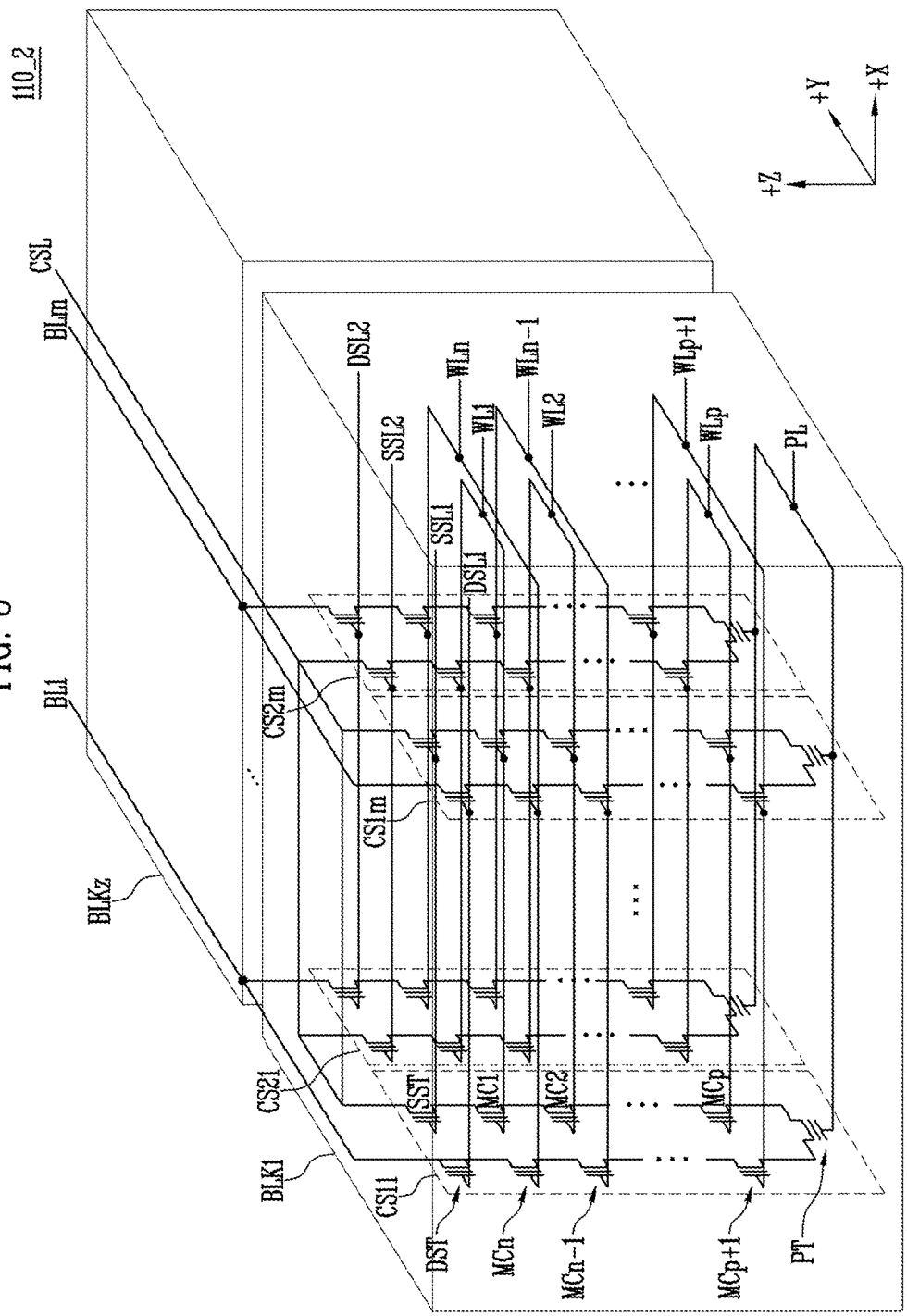
FIG. 3 is a diagram illustrating an embodiment of the memory cell array of FIG. 1.

FIG. 3 is a diagram illustrating an embodiment of a memory cell array 110_2 of the memory cell array 110 of FIG. 1.

Referring to FIG. 3, a memory cell array 110_2 includes a plurality of memory blocks BLK1 to BLKz. In FIG. 3, for the sake of description, the internal configuration of the first memory block BLK1 is illustrated, and the internal configuration of the other memory blocks BLK2 to BLKz is omitted. It will be understood that each of the second to z-th memory blocks BLK2 to BLKz has the same configuration as that of the first memory block BLK1.

Referring to FIG. 3, the first memory block BLK1 includes a plurality of cell strings CS11 to CS1m and CS21 to CS2m. In an embodiment, each of the cell strings CS11 to CS1m and CS21 to CS2m may be formed in a 'U' shape. In the first memory block BLK1, an 'm' number of cell strings are arranged in a row direction (i.e. a positive (+) X direction). In FIG. 3, two cell strings are illustrated as being arranged in a column direction (i.e. a positive (+) Y direction). However, this illustration is made for convenience of description, and it will be understood that three or more cell strings may be arranged in the column direction.

Each of the plurality of cell strings CS11 to CS1m and CS21 to CS2m includes at least one source select transistor SST, first to n-th memory cells MC1 to MCn, a pipe transistor PT, and at least one drain select transistor DST.

The select transistors SST and DST and the memory cells MC1 to MCn may have similar structures. In an embodiment, each of the select transistors SST and DST and the memory cells MC1 to MCn may include a channel layer, a tunneling insulating layer, a charge storage layer, and a blocking insulating layer. In an embodiment, a pillar for providing the channel layer may be provided to each cell string. In an embodiment, a pillar for providing at least one of the channel layer, the tunneling insulating layer, the charge storage layer, and the blocking insulating layer may be provided to each cell string.

The source select transistor SST of each cell string is coupled between the common source line CSL and the memory cells MC1 to MCp.

In an embodiment, source select transistors of cell strings arranged in the same row are coupled to a source select line extending in a row direction, and source select transistors of cell strings arranged in different rows are coupled to different source select lines. In FIG. 3, source select transistors of cell strings CS11 to CS1m in a first row are coupled to a first source select line SSL1. Source select transistors of cell strings CS21 to CS2m in a second row are coupled to a second source select line SSL2.

In an embodiment, source select transistors of the cell strings CS11 to CS1m and CS21 to CS2m may be coupled in common to a single source select line.

The first to n-th memory cells MC1 to MCn in each cell string are coupled between the source select transistor SST and the drain select transistor DST.

The first to n-th memory cells MC1 to MCn may be divided into first to p-th memory cells MC1 to MCp and p+1-th to n-th memory cells MCp+1 to MCn. The first to p-th memory cells MC1 to MCp are successively arranged in a direction opposite to a positive (+) Z direction and are coupled in series between the source select transistor SST and the pipe transistor PT. The p+1-th to n-th memory cells MCp+1 to MCn are successively arranged in the +Z direction and are coupled in series between the pipe transistor PT and the drain select transistor DST. The first to p-th memory cells MC1 to MCp and the p+1-th to n-th memory cells MCp+1 to MCn are coupled to each other through the pipe transistor PT. The gates of the first to n-th memory cells MC1 to MCn of each cell string are coupled to first to n-th word lines WL1 to WLn, respectively.

The gates of the respective pipe transistors PT of the cell strings are coupled to a pipeline PL.

The drain select transistor DST of each cell string is coupled between the corresponding bit line and the memory cells MCp+1 to MCn. The cell strings arranged in the row direction are coupled to drain select lines extending in the row direction. Drain select transistors of the cell strings CS11 to CS1m in the first row are coupled to a first drain select line DSL1. Drain select transistors of the cell strings CS21 to CS2m in the second row are coupled to a second drain select line DSL2.

Cell strings arranged in the column direction are coupled to bit lines extending in the column direction. In FIG. 3, cell strings CS11 and CS21 in a first column are coupled to a first bit line BL1. Cell strings CS1m and CS2m in an m-th column are coupled to an m-th bit line BLm.

Memory cells coupled to the same word line in cell strings arranged in a row direction form a single page. For example, memory cells coupled to the first word line WL1, among the cell strings CS11 to CS1m in the first row, form a single page. Memory cells coupled to the first word line WL1, among the cell strings CS21 to CS2m in the second row, form another single page. Cell strings arranged in the direction of a single row may be selected by selecting any one of the drain select lines DSL1 and DSL2. A single page may be selected from the selected cell strings by selecting any one of the word lines WL1 to WLn.

Figure 4:
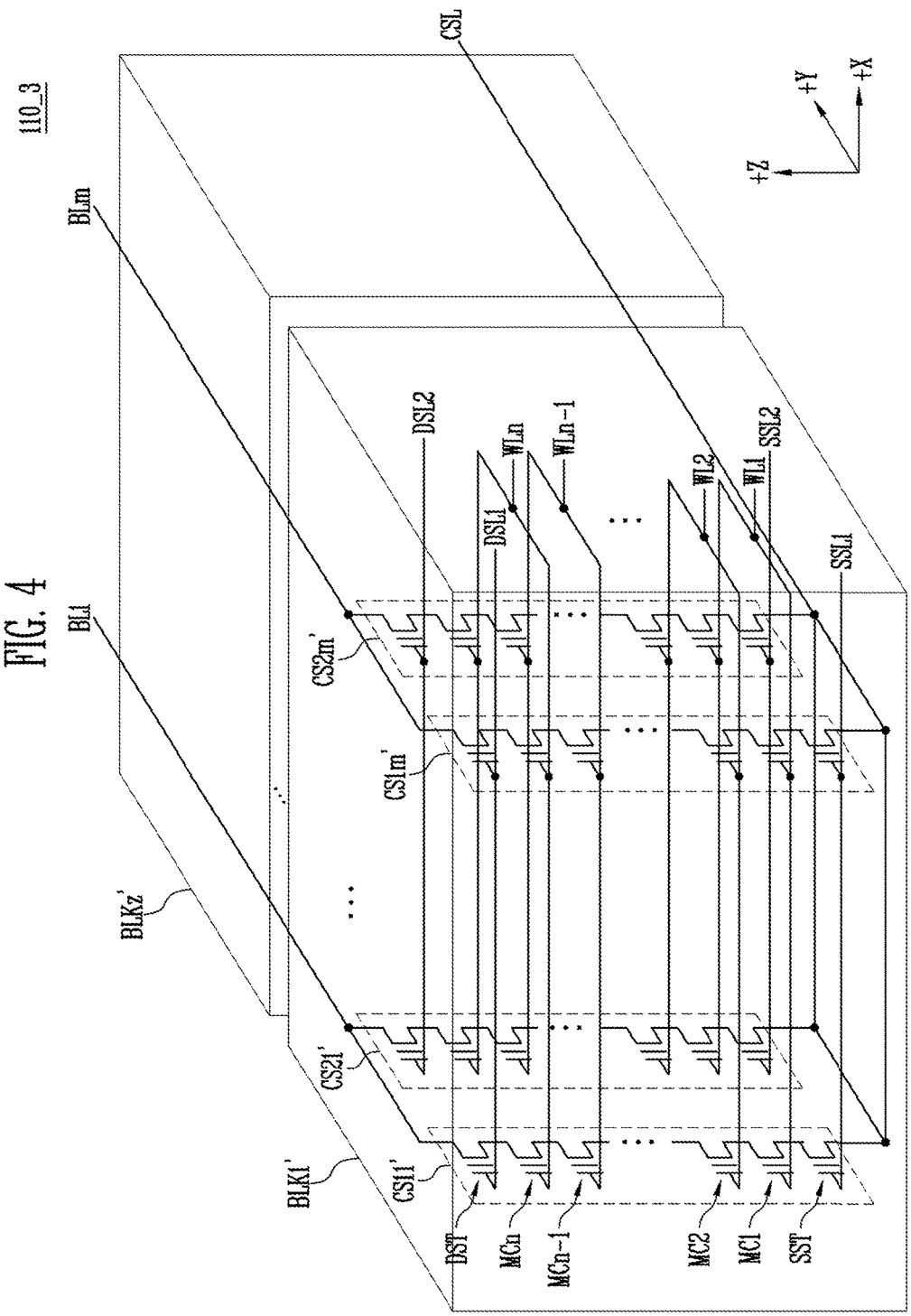
FIG. 4 is a diagram illustrating an embodiment of the memory cell array of FIG. 1.

FIG. 4 is a diagram illustrating an embodiment of a memory cell array 110_3 of the memory cell array 110 of FIG. 1.

Referring to FIG. 4, a memory cell array 110_3 includes a plurality of memory blocks BLK1' to BLKz'. In FIG. 4, for the sake of description, the internal configuration of the first memory block BLK1' is illustrated, and the internal configuration of the other memory blocks BLK2' to BLKz' is omitted. It will be understood that each of the second to z-th memory blocks BLK2' to BLKz' has the same configuration as that of the first memory block BLK1'.

The first memory block BLK1' includes a plurality of cell strings CS11' to CS1m' and CS21' to CS2m'. Each of the plurality of cell strings CS11' to CS1m' and CS21' to CS2m' extends in a positive +Z direction. In the first memory block BLK1, m cell strings are arranged in the +X direction. In FIG. 4, two cell strings are illustrated as being arranged in a +Y direction. However, this illustration is made for convenience of description, and it will be understood that three or more cell strings may be arranged in the column direction.

Each of the cell strings CS11' to CS1m' and CS21' to CS2m' includes at least one source select transistor SST, first to n-th memory cells MC1 to MCn, and at least one drain select transistor DST.

The source select transistor SST of each cell string is coupled between the common source line CSL and the memory cells MC1 to MCn. The source select transistors of cell strings arranged in the same row are coupled to the same source select line. Source select transistors of cell strings CS11' to CS1m' arranged in a first row are coupled to a first source select line SSL1. Source select transistors of cell strings CS21' to CS2m' arranged in a second row are coupled to a second source select line 55L2. In an embodiment, source select transistors of the cell strings CS11' to CS1m' and CS21' to CS2m' may be coupled in common to a single source select line.

The first to n-th memory cells MC1 to MCn in each cell string are coupled in series between the source select transistor SST and the drain select transistor DST. Gates of the first to n-th memory cells MC1 to MCn are respectively coupled to first to n-th word lines WL1 to WLn.

The drain select transistor DST of each cell string is coupled between the corresponding bit line and the memory cells MC1 to MCn. Drain select transistors of cell strings arranged in the row direction are coupled to drain select lines extending in the row direction. Drain select transistors of cell strings CS11' to CS1m' in the first row are coupled to a first drain select line DSL1. Drain select transistors of cell strings CS21' to CS2m' in the second row are coupled to a second drain select line DSL2.

As a result, the memory block BLK1' of FIG. 4 has an equivalent circuit similar to that of the memory block BLK1 of FIG. 3 except that a pipe transistor PT is excluded from each cell string.

Figure 5:
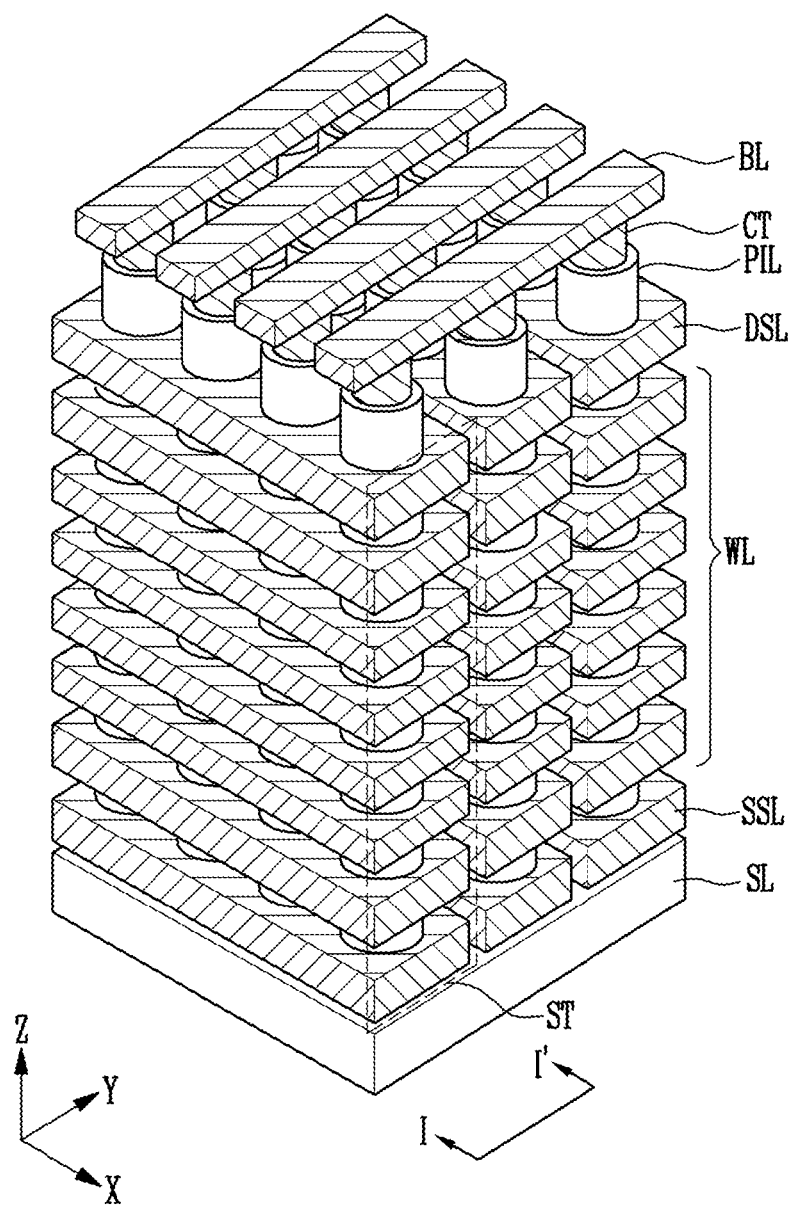
FIG. 5 is a perspective view illustrating an embodiment of a memory block having a three-dimensional structure.

FIG. 5 is a perspective view illustrating an embodiment of a memory block having a three-dimensional structure.

Referring to FIG. 5, the memory block having a three-dimensional structure may include cell strings ST formed in a vertical direction (e.g., Z-direction) on a substrate and arranged between the bit lines BL and the source lines SL. For example, the cell strings ST may be formed in an I-shape. This structure may be called "Bit Cost Scalable" (BiCS). The memory block illustrated in FIG. 4 may be formed of the memory block illustrated in FIG. 5. For example, in the case where the source line SL is horizontally formed on the substrate, the cell strings ST having a BiCS structure may be formed vertically on the source line SL. For example, the strings ST may include source select lines SSL, word lines WL and drain select lines DSL, which are arranged in a first direction (e.g., Y direction) and spaced apart from each other. The number of source select lines SSL, the number of word lines WL and the number of drain select lines DSL are not limited to those illustrated in FIG. 5 and may be changed depending on the structure of the memory device.

The cell strings ST may include pillars PIL which vertically pass through the source select lines SSL, the word lines WL, and drain select lines DSL, and bit lines BL which are coupled with upper ends of the pillars PIL protruding upward from the drain select lines DSL and are arranged in a second direction (e.g., X direction) perpendicular to the first direction (e.g., Y direction).

Each pillar PIL may include a vertical channel layer and a memory layer. For example, the memory layer may be formed in a cylindrical shape along an inner side surface of a vertical hole which vertically passes the corresponding source select line SSL, the word lines WL, and the corresponding drain select line DSL. The vertical channel layer may be formed in a hollow or solid cylindrical shape on an inner surface of memory layer. In the case where the vertical channel layer has a hollow cylindrical shape, space defined in the vertical channel layer may be filled with a vertical insulating layer. The vertical channel layer may be formed of a polysilicon layer. The memory layer may be formed in a cylindrical shape, enclosing the vertical channel layer, and include a tunnel insulating layer, a charge trap layer, and a blocking layer. Portions of the memory layer that make contact with the word lines WL may form memory cells.

A contact plug CT may be further formed between each bit line BL and a corresponding pillar PIL. Memory cells coupled to the same word line may be defined as a page. Here, the page may mean a physical structure, and each physical page may include a plurality of logical pages.

A program operation may be performed on a page basis. A partial erase operation may be performed on one or more pages.

Figure 6:
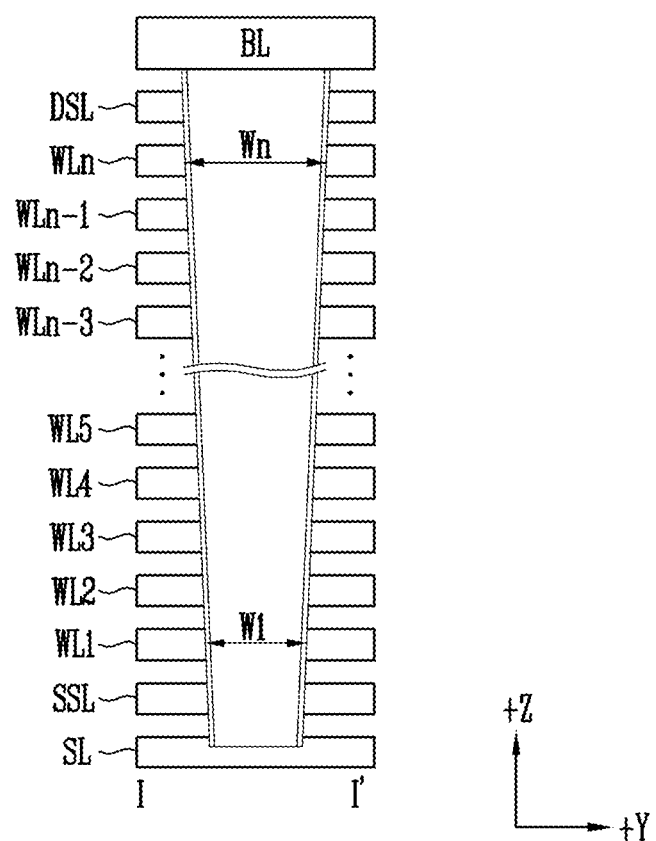
FIG. 6 is a sectional view illustrating a cell string formed in a single stack structure.

FIG. 6 is a sectional view illustrating a cell string formed in a single stack structure. Particularly, FIG. 6 illustrates a sectional view of the BiCS structure taken along line I-I' of FIG. 5.

Referring to FIG. 6, a single stack refers to a single stack structure in which a pillar PIL is formed in stacked word lines. The pillar PIL may include a memory layer and a vertical channel layer CH. Because a result of a verify operation may be changed depending on current flowing through the vertical channel layer CH, the width of the pillar PIL may influence the reliability of the memory device. However, due to characteristics in a process of manufacturing the memory device, the width of the pillar PIL is gradually reduced from an upper end thereof to a lower end. Therefore, in an embodiment, as the width of the pillar PIL is reduced, a program step voltage of a program voltage to be applied to program a corresponding memory cell may be reduced. In the sectional view of FIG. 6, a channel width Wn of a memory cell coupled to an n-th word line WLn disposed at a comparatively upper position may be relatively large. Thereby, it is easy to control a threshold voltage of the corresponding memory cell. Hence, during a program operation on the memory cell coupled to the n-th word line WLn, a program voltage having a comparatively large program step voltage may be applied to the memory cell. In this case, even when a comparatively small number of program pulses are applied, it may become possible to program memory cells coupled to the n-th word line WLn.

A channel width W1 of a memory cell coupled with a first word line WL1 disposed at a comparatively lower position may be relatively small. Thereby, it is not easy to control a threshold voltage of the corresponding memory cell. Hence, during a program operation on the memory cell coupled to the first word line WL1, a program voltage having a comparatively small program step voltage may be applied to the memory cell. In this case, a comparatively large number of program pulses may be applied so that memory cells coupled to the first word line WL1 may be more stably programmed.

While a program voltage is applied to a selected word line, a pass voltage is applied to unselected word lines. In an embodiment, pulses constituting a pass voltage to be applied to the unselected word lines may have various values depending on a pass step voltage. That is, as values of program pulses constituting a program voltage are gradually increased, values of the pulses constituting the pass voltage may be gradually increased. In this case, the values of the pulses constituting the pass voltage may be determined based on a pass step voltage.

Relationship between a program step voltage and a program voltage, and relationship between a pass step voltage and a pass voltage will be described below with reference to FIG. 7.

Figure 7:
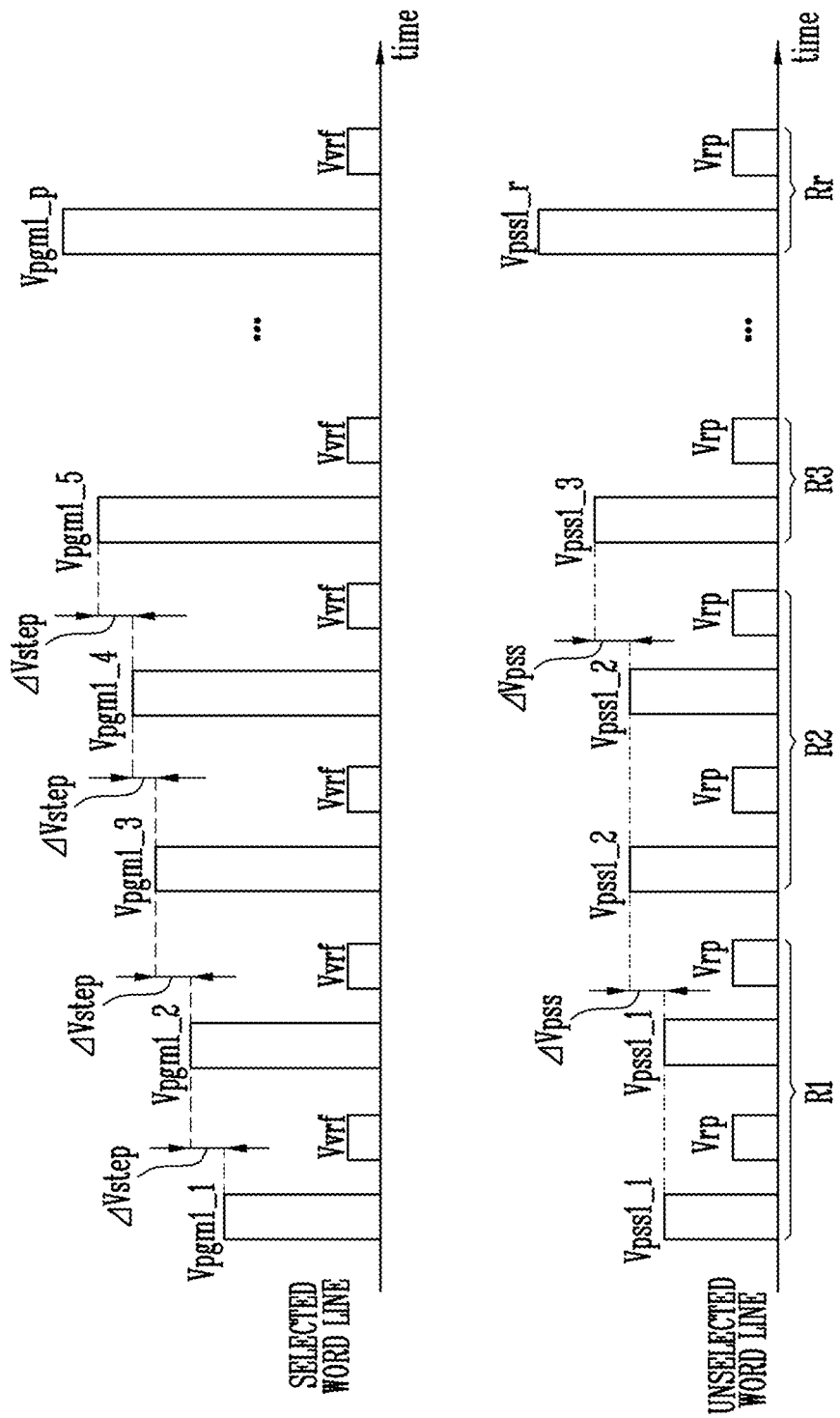
FIG. 7 is a timing diagram illustrating a program voltage and a pass voltage applied during a program operation.

FIG. 7 is a timing diagram illustrating a program voltage and a pass voltage applied during a program operation. For example, FIG. 7 is a timing diagram illustrating a program voltage applied to a selected word line and a pass voltage applied to unselected word lines during a program operation.

During a program operation, a first program pulse Vpgm1 is applied to a selected word line (e.g., WL1). First program pass pulses Vpss1_1 are applied to unselected word lines (e.g., WL2 to WLn). Thereafter, a program verify operation using a verify voltage Vvrf is performed. That is, a verify voltage Vvrf is applied to the selected word line. A verify pass voltage Vrp may be applied to the unselected word lines.

Until the program operation using the verify voltage Vvrf passes, the program and program verify operations may be repeated. Program pulses Vpgm1_2 to Vpgm1_$p$, which gradually increase, may be applied to the selected word line. The program pulses Vpgm1_2 to Vpgm1_$p$ are successively increased by a program step voltage ΔVstep. Every time each of the program pulses Vpgm1_2 to Vpgm1_$p$ is applied, a corresponding program pass pulse Vpass1_1 to Vpass1_$r$ is applied to the unselected word lines. When the program operation using the verify voltage Vvrf has passed, the program operation may be terminated.

Referring to the timing diagram of FIG. 7, the program pass pulses Vpss1_1 to Vpss1_$r$ constituting the pass voltage may be values, which successively increase by a pass step voltage ΔVpss. Furthermore, application of each program pass pulse may be repeated two times. That is, during a period R1, when the program pulses Vpgam1_1 and Vpgm1_2 are applied to the selected word line, the program pass pulse Vpss1_1 is repeatedly applied to the unselected word lines. During a period R2, when the program pulses Vpgam1_3 and Vpgm1_4 are applied to the selected word line, the program pass pulse Vpss1_2 is repeatedly applied to the unselected word lines. In the timing diagram illustrated in FIG. 7, "pass voltage repetition value" which is the number of times the same program pass pulse is applied is "2". However, the embodiments are not limited in this manner and in an embodiment, for example, a "pass voltage repetition value" which is the number of times the same program pass pulse Vpgam is applied during a period R may be greater than 2.

In an embodiment, it may be understood that the program voltage is formed of the program pulses Vpgm1_1 to Vpgm1_$p$ illustrated in FIG. 7, and the pass voltage is formed of the program pass pulses Vpass1_1 to Vpass1_$r$ illustrated in FIG. 7.

Figure 8:
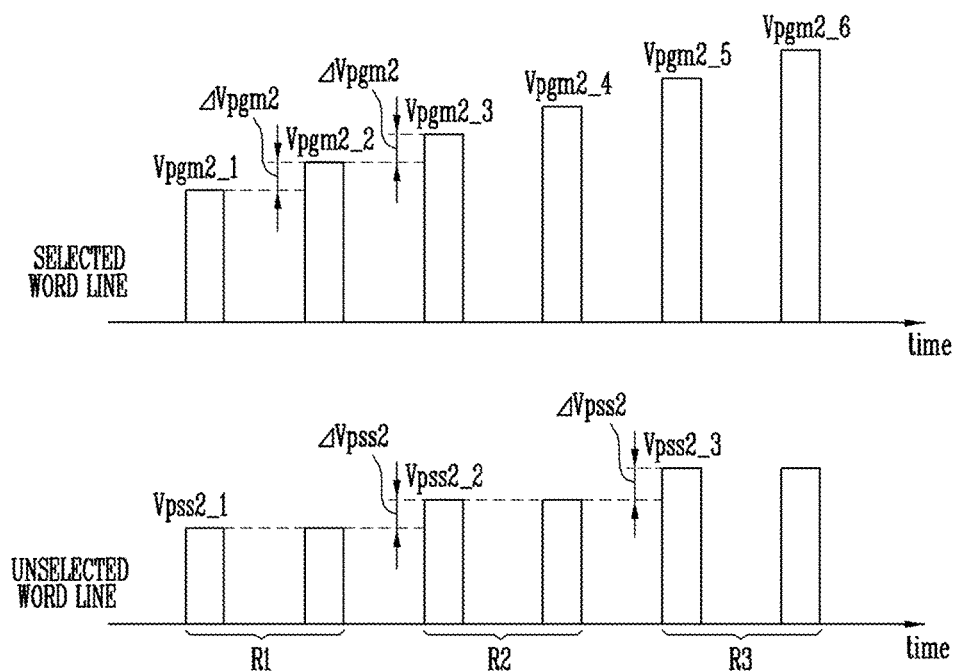
FIG. 8 is a timing diagram illustrating a program voltage and a pass voltage to be applied when a word line disposed in an upper portion of a stack is selected.
Figure 9:
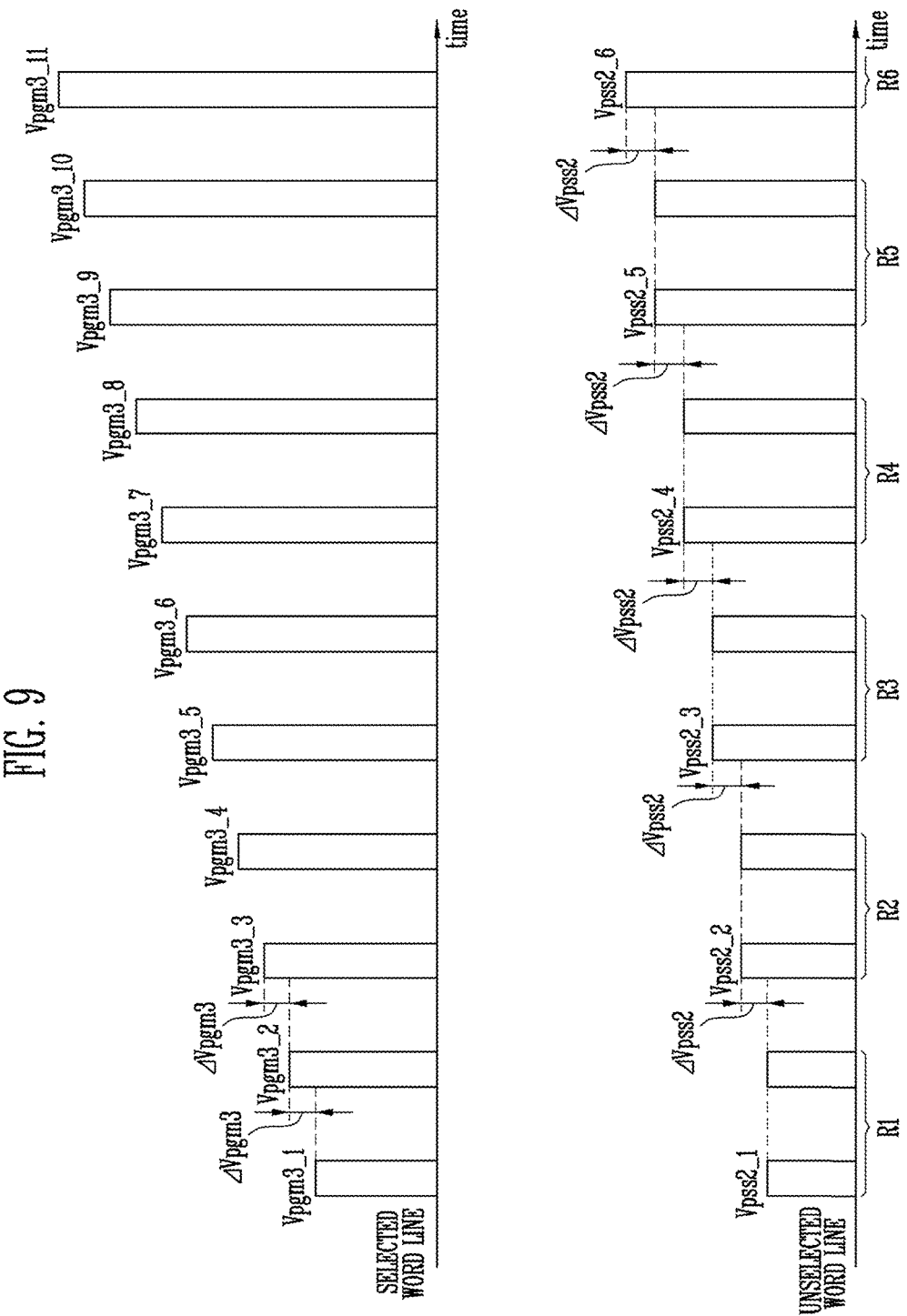
FIG. 9 is a timing diagram illustrating a program voltage and a pass voltage to be applied when a word line disposed in a lower portion of the stack is selected.

FIG. 8 is a timing diagram illustrating a program voltage and a pass voltage applied when the word line disposed in the upper portion of the stack is selected. FIG. 9 is a timing diagram illustrating a program voltage and a pass voltage applied when the word line disposed in the lower portion of the stack is selected.

Referring to FIG. 8, when a word line (e.g., WLn) disposed on the upper portion of the stack is selected, there are illustrated a program voltage to be applied to the word line WLn and a pass voltage to be applied to the unselected word lines (e.g., WL1 to WLn−1). For the sake of illustration, the verify voltage Vvrf and the verify pass voltage Vrp that have been illustrated in FIG. 7 are omitted in FIG. 8. In the following drawings, for the sake of illustration, the verify voltage Vvrf and the verify pass voltage Vrp will also be omitted.

As described above, when the word line WLn disposed on the upper portion of the stack is selected, it is easy to control the threshold voltages of the memory cells coupled to the corresponding word line. Therefore, a program step voltage ΔVpgm2, which is a difference between values of program pulses Vpgm2_1 to Vpgm2_6 constituting the program voltage, may have a relatively high value. In this case, the program operation on the memory cells coupled to the word line WLn may be completed by a relatively small number of times of application of program pulses Vpgm2_1 to Vpgm2_6.

Referring to FIG. 9, when a word line (e.g., WL1) disposed on the lower portion of the stack is selected, there are illustrated a program voltage to be applied to the word line WL1 and a pass voltage to be applied to the unselected word lines (e.g., WL2 to WLn). As described above, when the word line WL1 disposed on the lower portion of the stack is selected, it is not easy to control the threshold voltages of the memory cells coupled to the corresponding word line. Therefore, a program step voltage ΔVpgm3, which is a difference between values of program pulses Vpgm3_1 to Vpgm3_11 constituting the program voltage, may have a relatively high value. In this case, the program operation on the memory cells coupled to the word line WL1 may be completed by a relatively large number of times of application of program pulses Vpgm3_1 to Vpgm3_6. Referring to FIGS. 8 and 9 together, six times of application of program pulses Vpgm2_1 to Vpgm2_6 are illustrated in FIG. 8, but eleven times of application of program pulses Vpgm3_1 to Vpgm3_11 are illustrated in FIG. 9.

Typically, the pass voltage may be determined regardless of the position of the selected word line. Therefore, the cases of FIGS. 8 and 9 are the same as each other in the program pass pulse Vpass2_1 with which the pass voltage starts, and the pass step voltage ΔVpss2, which is a difference in voltage between pass pulses. Furthermore, the pass voltage repetition values of the cases of FIGS. 8 and 9, which are the number of times the same program pass pulse is repeatedly applied, are "2" the same as each other. That is, in the case of FIG. 8, during a period R1, the program pass pulse Vpass2_1 is repeatedly applied two times. During each period R2 or R3, the same program pass pulse Vpass2_2 or Vpass2_3 is repeatedly applied two times. Likewise, in the case of FIG. 9, during each of periods R1 to R5, a corresponding one of the program pass pulses Vpss2_1 to Vpss2_5 is repeatedly applied two times, and the last program pass pulse Vpss2_6 is applied during a period R6.

In the semiconductor memory device according to an embodiment of the present disclosure, a program voltage is determined based on the position of a selected word line in the stack of the cell string, and a program pass voltage is determined based on a program step voltage forming the program voltage. Therefore, depending on the position of the selected word line, the program voltage and the program pass voltage may be flexibly determined, whereby the performance of the semiconductor memory device may be enhanced.

Descriptions will be made with reference to FIGS. 10 to 15 for a method of determining the program voltage and the pass voltage according to the semiconductor memory device and the method of operating the same in accordance with an embodiment of the present disclosure.

Figure 10:
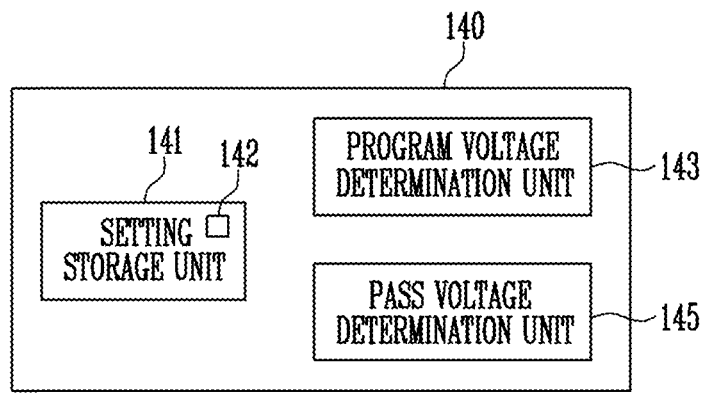
FIG. 10 is a block diagram illustrating an embodiment of a control logic illustrated in FIG. 1.

FIG. 10 is a block diagram illustrating an embodiment of the control logic illustrated in FIG. 1.

Referring to FIG. 10, the control logic 140 may include a setting storage unit 141, a program voltage determination unit 143, and a pass voltage determination unit 145. The setting storage unit 141 may store set values according to the position of a selected word line. The program voltage determination unit 143 may determine a program voltage to be applied to the selected word line based on the set values. The pass voltage determination unit 145 may determine a pass voltage to be applied to unselected word lines based on the set values.

The setting storage unit 141 may be embodied by a register in the control logic 140. Set values stored in the setting storage unit 141 may include program step voltages, pass step voltages, and pass voltage repetition values which correspond to positions of respective selected word lines. In an embodiment, the setting storage unit 141 may store set values, for example but not limited to those, illustrated in the following table 1.

TABLE 1

| Selected word line | Program step voltage | Pass step voltage | Pass voltage repetition value |
|---|---|---|---|
| WL1~WL8 | Vst1 | Vps1 | RP1 |
| WL9~WL16 | Vst2 | Vps2 | RP2 |
| WL17~WL24 | Vst3 | Vps3 | RP3 |
| WL25~WL32 | Vst4 | Vps4 | RP4 |

In Table 1, there is illustrated the case where the memory string include thirty-two memory cells. Therefore, thirty-two word lines WL1 to WL32 are coupled to memory cells in the memory string. Different set values may be assigned to respective word lines, but in the embodiment of Table 1, there is illustrated an example in which the word lines are grouped into four groups, and different set values are applied to the respective groups. Table 1 is provided only as an example. The number of memory cells included in the memory string, and the number of groups may be changed in various ways.

In the case where word lines WL1 to WL8 which belong to the first group are selected, the program step voltage, the pass step voltage, and the pass voltage repetition value are respectively determined as Vst1, Vps1, and RP1. Likewise, in the case where word lines which belong to each of the second to fourth groups are selected, set values illustrated in Table 1 may be selected.

In an embodiment, the setting storage unit 141 may include a group information generation unit 142 which generates group information about the word lines WL1 to WL32. In this case, the group information generation unit 142 may decode a column address among addresses applied to the semiconductor memory device and generate group information about that a word line corresponding to the associated address belongs to which one of the groups. The group information generation unit 142 may determine various values of the number of groups, as needed, and correspond the word lines WL1 to WL32 to the generated groups. According to an embodiment of Table 1, the group information generation unit 142 may generate four groups. For the four groups, the group information generation unit 142 may correspond word lines WL1 to WL8 to the first group, word lines WL8 to WL16 to the second group, word lines WL17 to WL24 to the third group, and word lines WL25 to WL32 to the fourth group. The setting storage unit 141 may assign, to each of the generated groups, a corresponding program step voltage, a corresponding pass step voltage, and a corresponding pass voltage repetition value.

The program voltage determination unit 143 may refer to a program step voltage stored in the setting storage unit 141, based on a selected word line. For example, in the case where the word line WL18 is selected, the program voltage determination unit 143 selects a program step voltage Vst3 stored in the setting storage unit 141. The program voltage determination unit 143 may determine program pulses based on the program step voltage Vst3, and determine a program voltage depending on the program pulses.

The pass voltage determination unit 145 may select a pass step voltage Vps3 and a pass voltage repetition value RP3, based on the selected program step voltage Vst3. The pass voltage determination unit 145 may determine program pass pulses based on the pass step voltage Vps3 and the pass voltage repetition value RP3, and determine a pass voltage depending on the program pass pulses.

The closer the selected word line to the upper portion of the cell string, the higher the voltage determined as the program step voltage by the program voltage determination unit 143 in the control logic 140. As illustrated in FIG. 6, in the case where the first word line WL1 is disposed in the lower portion of the stack and the thirty-second word line WL32 is disposed in the upper portion of the stack, the program step voltage Vst1 has the lowest value and the program step voltage Vst2 has a value higher than the program step voltage Vst1 to satisfy the above-mentioned conditions. Furthermore, the program step voltage Vst3 may have a value higher than the program step voltage Vst2, and the program step voltage Vst4 may have the highest value.

The higher the selected program step voltage value, the higher the voltage determined as the pass step voltage by the pass voltage determination unit 145 in the control logic 140. Therefore, according to an above-mentioned embodiment, the pass step voltage Vps1 may have the lowest value, and the pass step voltage Vps2 may have a value higher than the pass step voltage Vps1. Furthermore, the pass step voltage Vps3 may have a value higher than the pass step voltage Vps2, and the pass step voltage Vps4 may have the highest value.

The higher the selected program step voltage value, the less a count of the number of times determined as the pass voltage repetition value by the pass voltage determination unit 145 in the control logic 140. Therefore, according to an above-mentioned embodiment, the pass voltage repetition value RP1 may have the largest value, and the pass voltage repetition value RP2 may have a value less than the pass voltage repetition value RP1. Furthermore, the pass voltage repetition value RP3 may have a value less than the pass voltage repetition value RP2, and the pass voltage repetition value RP4 may have the smallest value.

The program voltage and the pass voltage which are determined depending on selection of setting values will be described later herein with reference to FIGS. 13 to 15.

Figure 11:
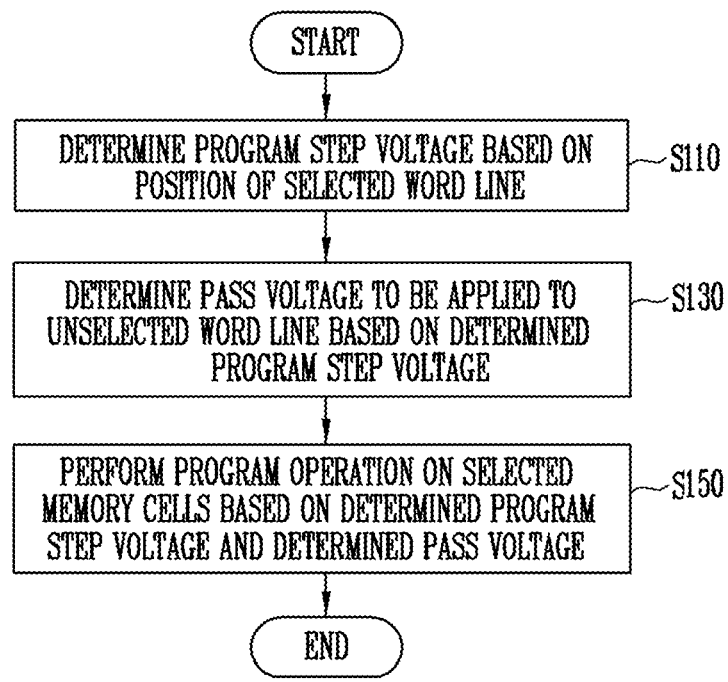
FIG. 11 is a flowchart illustrating a method of operating a semiconductor memory device in accordance with an embodiment of the present disclosure.

FIG. 11 is a flowchart illustrating a method of operating the semiconductor memory device in accordance with an embodiment of the present disclosure.

Referring to FIG. 11, a method of operating the semiconductor memory device in accordance with an embodiment of the present disclosure includes: step S110 of determining a program step voltage to be applied to a word line selected as a target to be programmed, based on a position of the selected word line; step S130 of determining a pass voltage to be applied to unselected word lines among the plurality of word lines, based on the determined program step voltage; and step S150 of performing a program operation on selected memory cells, based on the determined program step voltage and pass voltage.

At step S110, the program voltage determination unit 143 in the control logic 140 may determine a program step voltage with reference to the set values stored in the setting storage unit 141. Although not illustrated in FIG. 11, at step S110, a program voltage may be determined based on the program step voltage.

At step S130, the pass voltage determination unit 145 in the control logic 140 may determine a pass voltage with reference to the set values stored in the setting storage unit 141. In this case, the pass voltage determination unit 145 may determine the pass voltage based on the determined program step voltage. An embodiment of step S130 will be described later herein with reference to FIG. 12.

At step S150, a substantial program operation is performed. In an embodiment, before step S150, there is the need of determining a program voltage based on the determined program step voltage. Because the program voltage is determined based on the program step voltage, the program voltage may be determined at step S130, or the program voltage may be determined before or after step S130.

Figure 12:
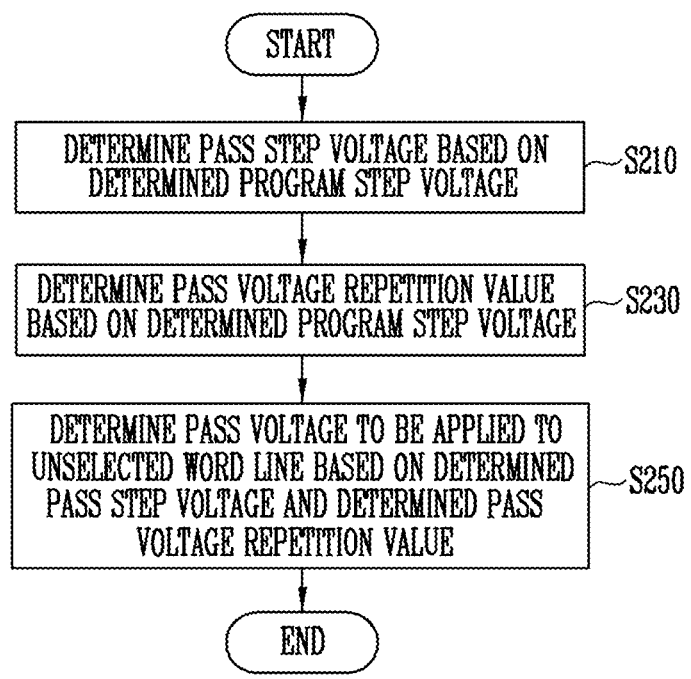
FIG. 12 is a flowchart illustrating an embodiment of determining a pass voltage.

FIG. 12 is a flowchart illustrating an embodiment of determining the pass voltage.

Referring to FIG. 12, step S130 illustrated in FIG. 11 may include: step S210 of determining a pass step voltage based on the determined program step voltage; step S230 of determining a pass voltage repetition value based on the determined program step voltage; and step S250 of determining a pass voltage to be applied to the unselected word lines based on the determined pass step voltage and the determined pass voltage repetition value.

Referring to Table 1 and FIGS. 10 and 12 together, at step S210, the pass voltage determination unit 145 may determine a pass step voltage with reference to the setting storage unit 141. In this case, depending on the selected program step voltage, any one of the pass step voltages Vps1 to Vps4 may be selected.

At step S230, the pass voltage determination unit 145 may determine a pass voltage repetition value with reference with the setting storage unit 141. In this case, depending on the selected program step voltage, any one of the pass voltage repetition values RP1 to RP4 may be selected.

At step S250, the pass voltage determination unit 145 may determine a pass voltage based on the determined pass step voltage and the determined pass voltage repetition value. Hereinbelow, an example of the pass voltage determined through the above-mentioned process will be described with reference to FIGS. 13 and 14.

Figure 13:
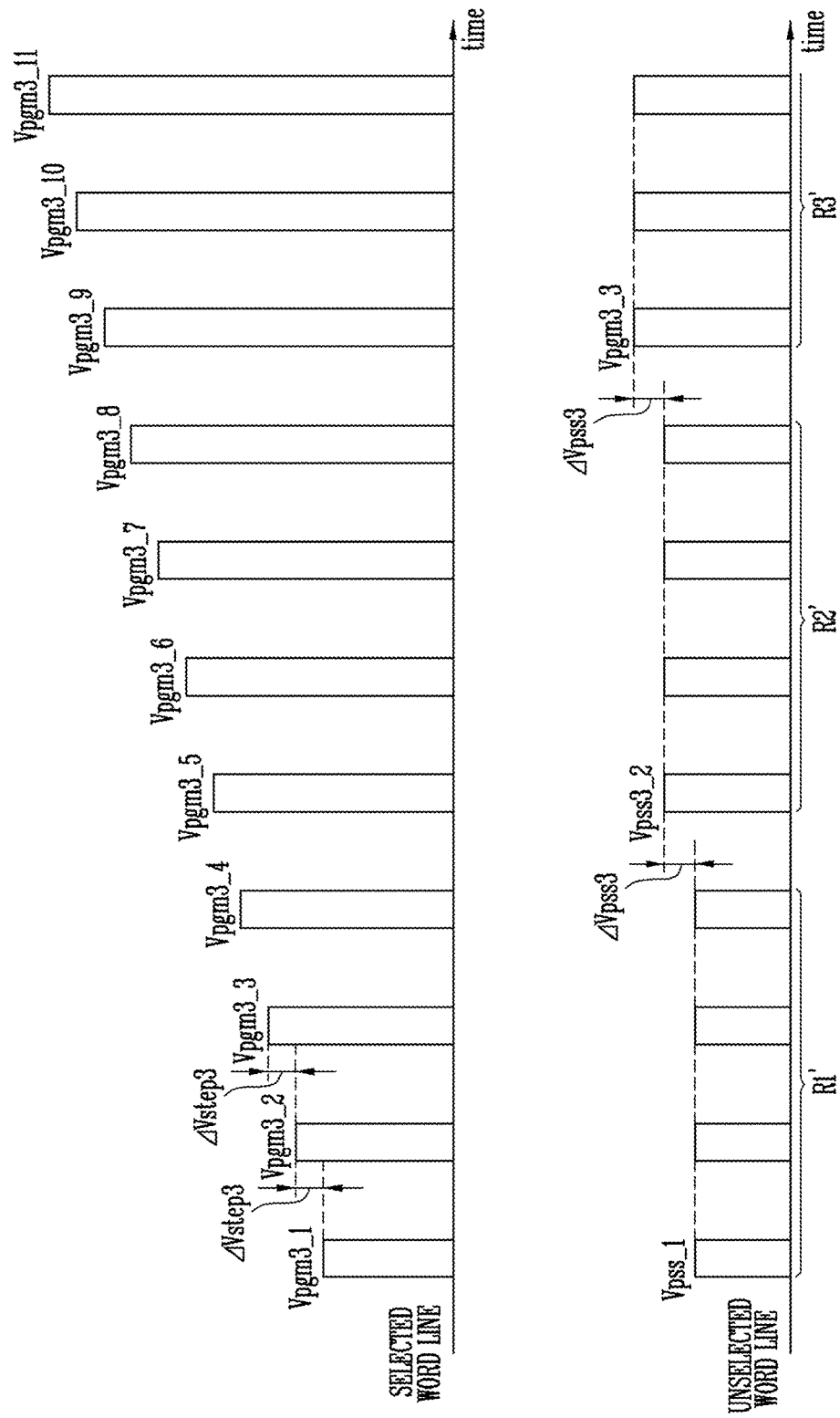
FIG. 13 is a timing diagram illustrating a program voltage and a pass voltage determined according to an embodiment of the present disclosure.

FIG. 13 is a timing diagram illustrating a program voltage and a pass voltage determined according to an embodiment of the present disclosure.

Referring to FIG. 13, a program voltage applied to the selected word line is illustrated as being substantially the same as the program voltage illustrated in FIG. 9. In FIG. 13, there is illustrated the case where a word line disposed in a relatively lower portion of the stack is selected. Therefore, compared to the case of FIG. 7 illustrating the program voltage and the pass voltage when a word line disposed in a relatively upper portion of the tack is selected, a program step voltage ΔVstep3 of the case of FIG. 13 is a relatively small value. That is, the program step voltage ΔVstep3 may be determined as a value of Vst1 in the example of Table 1. Depending on the determined program step voltage ΔVstep3, program pulses Vpgm3_1 to Vpgm3_11 are determined, whereby the program voltage is determined.

In the case of FIG. 13, the pass step voltage ΔVpss3 may be determined as a value less than the pass step voltage ΔVpss2 illustrate in FIG. 9. Furthermore, the pass voltage repetition value may be determined as "4". That is, the value RP1 in Table 1 may be "4". Hence, during each period R1, R2, each of the program pass pulses Vpss3_1 and Vpss3_2 may be applied four times, and during the last period R3', the program pass pulses Vpss3_3 may be applied three times. That is, the pass voltage may be determined depending on the determined pass step voltage ΔVpss3 and the determined pass voltage repetition value.

Figure 14:
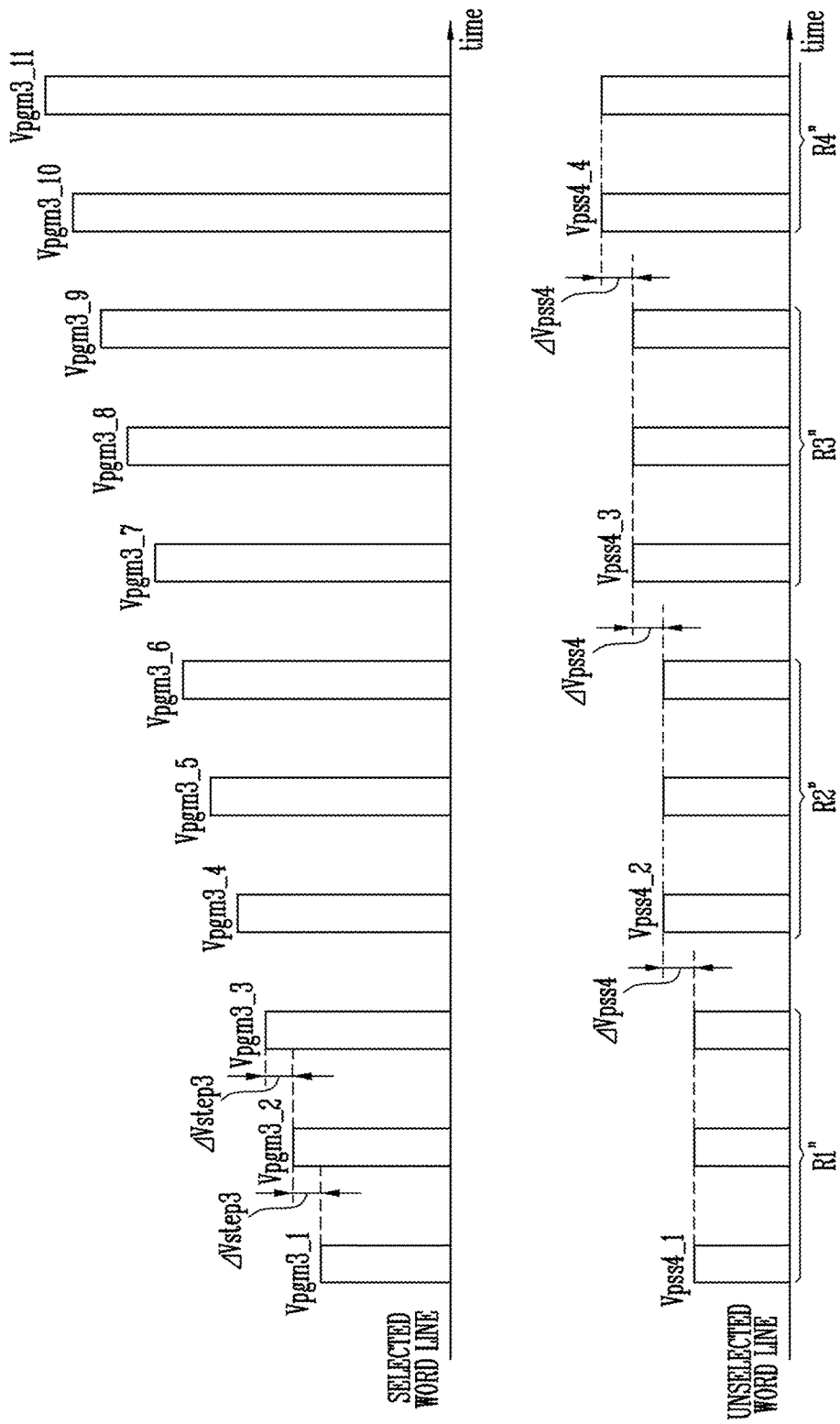
FIG. 14 is another timing diagram illustrating a program voltage and a pass voltage determined according to an embodiment of the present disclosure.

FIG. 14 is another timing diagram illustrating a program voltage and a pass voltage determined according to an embodiment of the present disclosure.

Referring to FIG. 14, a program voltage applied to the selected word line is illustrated as being substantially the same as the program voltage illustrated in FIG. 9. In a manner similar to the case of FIG. 13, a word line disposed in a relatively lower portion of the stack is also selected in the case of FIG. 14. Therefore, compared to the case of FIG. 7 illustrating the program voltage and the pass voltage when a word line disposed in a relatively upper portion of the stack is selected, a program step voltage ΔVstep3 of the case of FIG. 14 is a relatively small value. That is, the program step voltage ΔVstep3 may be determined as a value of Vst1 in the example of Table 1. Depending on the determined program step voltage ΔVstep3, program pulses Vpgm3_1 to Vpgm3_11 are determined, whereby the program voltage is determined.

In the case of FIG. 14, the pass step voltage ΔVpss4 may be determined as a value less than the pass step voltage ΔVpss3 illustrated in FIG. 13. Furthermore, the pass voltage repetition value may be determined as "3". That is, the value RP1 in Table 1 may be "3". Hence, during each period R1", R2", R3", each of the program pass pulses Vpss4_1, Vpss4_2 and Vpss4_3 may be applied three times, and during the last period R4", the program pass pulses Vpss4_4 may be applied two times. That is, the pass voltage may be determined depending on the determined pass step voltage ΔVpss4 and the determined pass voltage repetition value.

Figure 15:
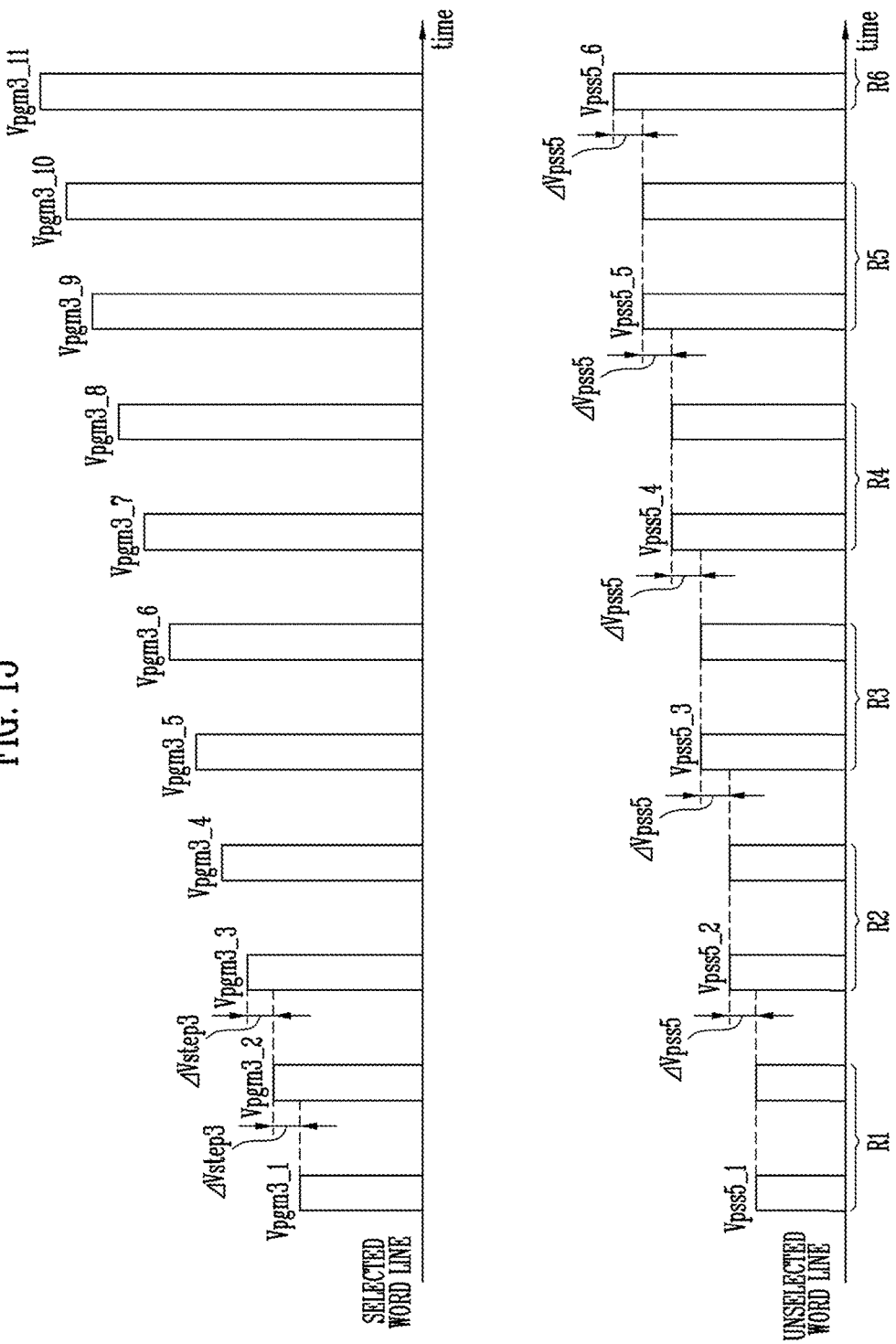
FIG. 15 is still another timing diagram illustrating a program voltage and a pass voltage determined according to an embodiment of the present disclosure.

FIG. 15 is still another timing diagram illustrating a program voltage and a pass voltage determined according to an embodiment of the present disclosure.

In the embodiment of FIG. 15, the pass step voltage ΔVpss5 may be determined as a value less than the pass step voltage ΔVpss4 illustrated in FIG. 14. Furthermore, the pass voltage repetition value may be determined as "2". In an embodiment of the present disclosure, the pass voltage repetition may be maintained in a fixed value, and only the pass step voltage may be changed. That is, each of the values RP1 to RP4 in Table 1 may be "2". Hence, during each of the periods R1 to R5, each of the program pass pulses Vpss5_1 and Vpss5_5 may be applied two times, and during the last period R6, the program pass pulses Vpss5_6 may be applied once. That is, the pass voltage may be determined depending on the determined pass step voltage ΔVpss5 and the determined pass voltage repetition value.

Figure 16:
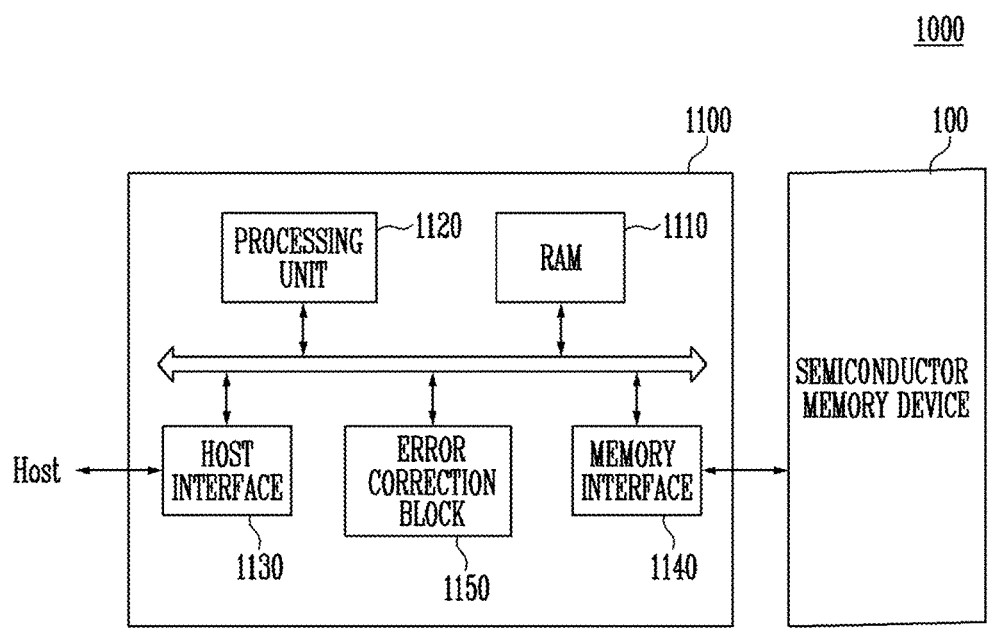
FIG. 16 is a block diagram illustrating a memory system including the semiconductor memory device of FIG. 1.

FIG. 16 is a block diagram illustrating a memory system including the semiconductor memory device of FIG. 1.

Referring FIG. 16, the memory system 1000 includes a semiconductor memory device 100 and a controller 1100. The semiconductor memory device 100 may have the same configuration and operation as those of the semiconductor memory devices described with reference to FIG. 1. Hereinafter, repetitive explanations will be omitted.

The controller 1100 may be coupled to a host Host and the semiconductor memory device 100. The controller 1100 may access the semiconductor memory device 100 in response to a request from the host Host. For example, the controller 1100 may control read, write, erase, and background operations of the semiconductor memory device 100. The controller 1100 may provide an interface between the host Host and the semiconductor memory device 100. The controller 1100 is configured to drive firmware for controlling the semiconductor memory device 100.

The controller 1100 includes a random access memory (RAM) 1110, a processing unit 1120, a host interface 1130, a memory interface 1140, and an error correction block 1150. The RAM 1110 is used as at least one of an operation memory of the processing unit 1120, a cache memory between the semiconductor memory device 100 and the host Host, and a buffer memory between the semiconductor memory device 100 and the host Host. The processing unit 1120 controls the overall operation of the controller 1100. In addition, the controller 1100 may temporarily store program data provided from the host Host during the write operation.

The host interface 1130 may include a protocol for performing data exchange between the host Host and the controller 1100. In an example of an embodiment, the controller 1100 may communicate with the host Host through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, and an integrated drive electronics (IDE) protocol, a private protocol, and the like.

The memory interface 1140 interfaces with the semiconductor memory device 100. For example, the memory interface includes a NAND interface or a NOR interface.

The error correction block 1150 uses an error correcting code (ECC) to detect and correct an error in data received from the semiconductor memory device 100. The processing unit 1120 may adjust the read voltage according to an error detection result from the error correction block 1150, and control the semiconductor memory device 100 to perform re-reading. In an example of an embodiment, the error correction block may be provided as an element of the controller 1100.

The controller 1100 and the semiconductor memory device 100 may be integrated into a single semiconductor device. In an example of an embodiment, the controller 1100 and the semiconductor memory device 100 may be integrated into a single semiconductor device to form a memory card. For example, the controller 1100 and the semiconductor memory device 100 may be integrated into a single semiconductor device and form a memory card such as a personal computer memory card international association (PCMCIA), a compact flash card (CF), a smart media card (SM or SMC), a memory stick multimedia card (MMC, RS-MMC, or MMCmicro), a SD card (SD, miniSD, microSD, or SDHC), a universal flash storage (UFS), and the like The controller 1100 and the semiconductor memory device 100 may be integrated into a single semiconductor device to form a solid state drive (SSD). The SSD includes a storage device formed to store data in a semiconductor memory. When the memory system 1000 is used as the SSD, an operation speed of the host Host coupled to the memory system 1000 may be phenomenally improved.

In an embodiment, the memory system 1000 may be provided as one of various elements of an electronic device such as a computer, a ultra mobile PC (UMPC), a workstation, a net-book, a personal digital assistants (PDA), a portable computer, a web tablet, a wireless phone, a mobile phone, a smart phone, an e-book, a portable multimedia player (PMP), a game console, a navigation device, a black box, a digital camera, a 3-dimensional television, a digital audio recorder, a digital audio player, a digital picture recorder, a digital picture player, a digital video recorder, a digital video player, a device capable of transmitting/receiving information in an wireless environment, one of various devices for forming a home network, one of various electronic devices for forming a computer network, one of various electronic devices for forming a telematics network, an RFID device, one of various elements for forming a computing system, or the like.

In an embodiment, the semiconductor memory device 100 or the memory system 1000 may be embedded in various types of packages. For example, the semiconductor memory device 100 or the memory system 1000 may be packaged in a type such as Package on Package (PoP), Ball grid arrays (BGAs), Chip scale packages (CSPs), Plastic Leaded Chip Carrier (PLCC), Plastic Dual In Line Package (PDIP), Die in Waffle Pack, Die in Wafer Form, Chip On Board (COB), Ceramic Dual In Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), or the like.

Figure 17:
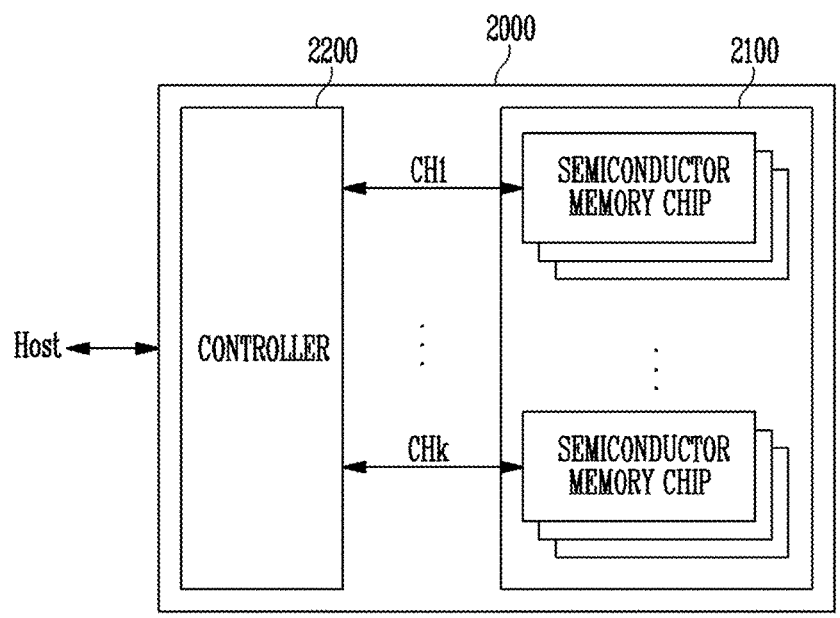
FIG. 17 is a block diagram illustrating an example of application of the memory system of FIG. 16.

FIG. 17 is a block diagram illustrating an example of application of the memory system of FIG. 16.

Referring to FIG. 17, the memory system 2000 includes a semiconductor memory device 2100 and a controller 2200. The semiconductor memory device 2100 includes a plurality of semiconductor memory chips. The semiconductor memory chips are divided into a plurality of groups.

Referring to FIG. 17, it is illustrated that each of the plurality of groups communicates with the controller 2200 through first to k-th channels CH1 to CHk. Each semiconductor memory chip may have the same configuration and operation as those of an embodiment of the semiconductor memory device 100 described with reference to FIG. 1.

Each group communicates with the controller 2200 through one common channel. The controller 2200 has the same configuration as that of the controller 1100 described with reference to FIG. 16 and is configured to control a plurality of memory chips of the semiconductor memory device 2100 through the plurality of channels CH1 to CHk.

Figure 18:
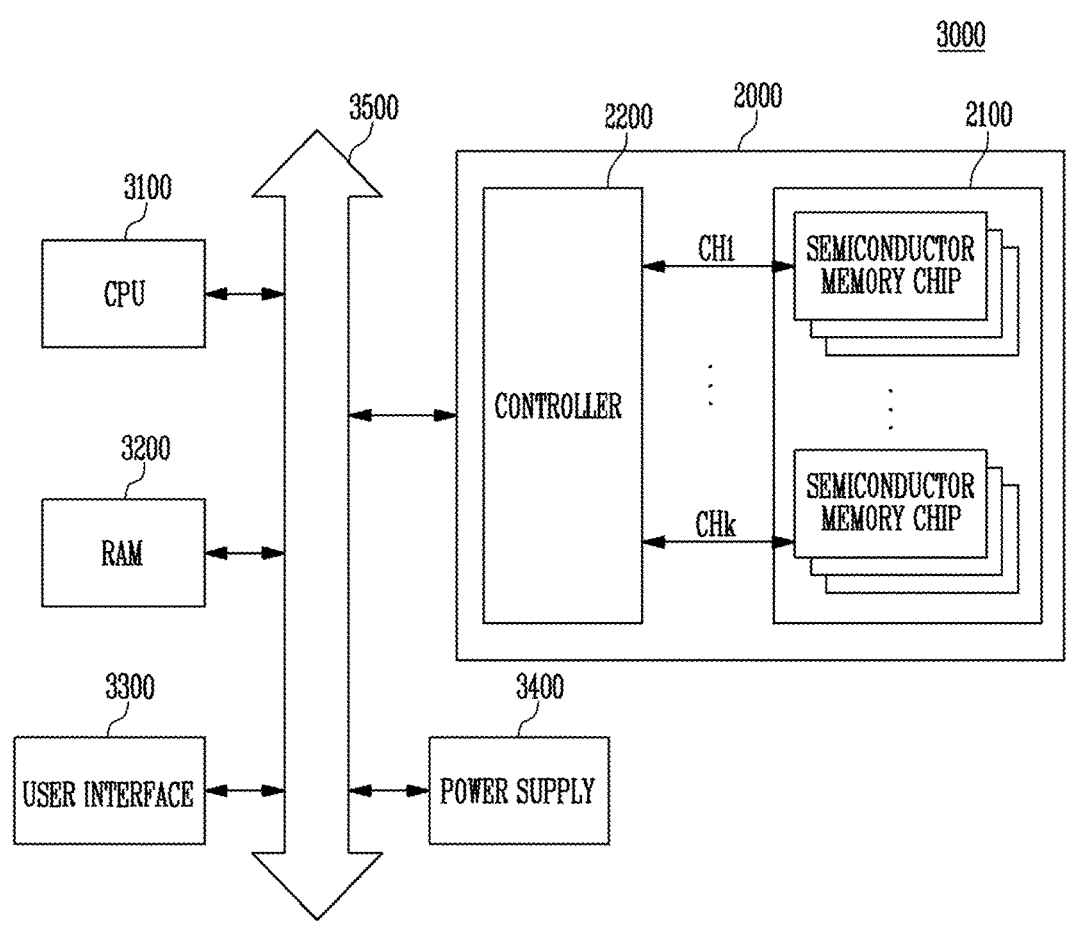
FIG. 18 is a block diagram illustrating a computing system including the memory system illustrated with reference to FIG. 17.

FIG. 18 is a block diagram illustrating a computing system including the memory system of FIG. 17.

The computing system 3000 may include a central processing unit 3100, a RAM 3200, a user interface 3300, a power supply 3400, a system bus 3500, and a memory system 2000.

The memory system 2000 is electrically coupled to the CPU 3100, the RAM 3200, the user interface 3300, and the power supply 3400 through the system bus 3500. Data provided through the user interface 3300 or processed by the CPU 3100 is stored in the memory system 2000.

Referring to FIG. 18, the semiconductor memory device 2100 is illustrated as being coupled to the system bus 3500 through the controller 2200. However, the semiconductor memory device 2100 may be directly coupled to the system bus 3500. The function of the controller 2200 may be performed by the CPU 3100 and the RAM 3200.

Referring to FIG. 18, the memory system 2000 described with reference to FIG. 17 may be provided. However, the memory system 2000 may be replaced with the memory system 1000 described with reference to FIG. 16. In an embodiment, the computing system 3000 may include all of the memory systems 1000 and 2000 described with reference to FIGS. 16 and 17.

Various embodiments of the present disclosure may provide a semiconductor memory device having improved program operating characteristics.

Various embodiments of the present disclosure may provide a method of operating a semiconductor memory device having improved program operating characteristics.

Examples of embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A semiconductor memory device comprising:
   a memory cell array including a plurality of cell strings;
   a read and write (read/write) circuit configured to perform a read operation or a program operation on the memory cell array; and
   a control logic configured to control the read/write circuit to perform the read operation or the program operation on the memory cell array,
   wherein each of the plurality of cell strings includes a plurality of memory cells coupled with corresponding word lines,
   wherein, during the program operation, the control logic is configured to determine, based on a position of a selected memory cell in the cell string, a program step voltage to be applied to a selected word line coupled to the selected memory cell, and is configured to determine a pass voltage to be applied to an unselected word line based on the program step voltage, and
   wherein the program step voltage has a higher value than 0V.

2. The semiconductor memory device according to claim 1,
   wherein the control logic increases the program step voltage to be determined as the position of the selected memory cell coupled to the selected word line becomes closer to a drain select transistor of the cell string, and
   wherein the control logic determines a program voltage to be applied to the selected word line based on the determined program step voltage.

3. The semiconductor memory device according to claim 1,
   wherein the control logic increases the program step voltage to be determined as a channel width for the selected memory cell in the cell string becomes wider, and
   wherein the control logic determines a program voltage to be applied to the selected word line based on the determined program step voltage.

4. The semiconductor memory device according to claim 2, wherein the control logic determines the pass voltage to be applied to the unselected word line based on the determined program step voltage.

5. The semiconductor memory device according to claim 1, wherein the control logic comprises:
a setting storage unit configured to store set values according to a position of the selected word line;
a program voltage determination unit configured to determine a program voltage to be applied to the selected word line based on the set values; and
a pass voltage determination unit configured to determine the pass voltage to be applied to the unselected word line based on the set values.

6. The semiconductor memory device according to claim 5, further comprising:
an address decoder coupled to the word lines and configured to decode a column address of received addresses; and
a voltage generation unit configured to generate the determined program voltage and the determined pass voltage and transmit the generated program voltage and the generated pass voltage to the address decoder,
wherein the setting storage unit comprises
a group information generation unit configured to generate group information that is information about a group to which the selected word line belongs.

7. The semiconductor memory device according to claim 6, wherein the program voltage determination unit selects the program voltage to be applied to the selected word line among the set values based on the group information.

8. The semiconductor memory device according to claim 5, wherein the set values include program step voltage values according to the position of the selected word line, and the program voltage determination unit selects one of the program step voltage values and determines the program voltage.

9. The semiconductor memory device according to claim 8, wherein the set values further include pass step voltage values according to the program step voltage values, and the pass voltage determination unit selects one of the pass step voltage values and determines the pass voltage.

10. The semiconductor memory device according to claim 9, wherein as the selected program step voltage value is increased, the pass step voltage selected among the pass step voltage values is increased.

11. The semiconductor memory device according to claim 8, wherein the set values further include pass voltage repetition values according to the program step voltage values, and the pass voltage determination unit selects one of the pass voltage repetition values and determines the pass voltage.

12. The semiconductor memory device according to claim 11, wherein, as the selected program step voltage value is increased, the pass voltage repetition value selected among the pass voltage repetition values is reduced.

13. A method of operating a semiconductor memory device, comprising:
determining a program step voltage to be applied to a word line connected to a memory cell selected as a target to be programmed among a plurality of memory cells included in a cell string, based on a position of the selected memory cell;
determining a pass voltage to be applied to an unselected word line among the plurality of word lines, based on the determined program step voltage; and
performing a program operation on selected memory cells based on the determined program step voltage and the determined pass voltage,
wherein the program step voltage has a higher value than 0V.

14. The method according to claim 13, wherein the determining of the program step voltage to be applied to the selected word line comprises
increasing the determined program step voltage as the position of the selected memory cell coupled to the selected word line becomes closer to a drain select transistor of the cell string.

15. The method according to claim 13, wherein the determining of the program step voltage to be applied to the selected word line comprises
increasing the determined program step voltage as a channel width for the selected memory cell coupled to the selected word line becomes wider.

16. The method according to claim 13, wherein the determining of the pass voltage to be applied to the unselected word line comprises:
determining a pass step voltage based on the determined program step voltage;
determining a pass voltage repetition value based on the determined program step voltage; and
determining the pass voltage to be applied to the unselected word line based on the determined pass step voltage and the determined pass voltage repetition value.

17. The method according to claim 16, wherein the determining of the pass step voltage based on the determined program step voltage comprises:
increasing the determined pass step voltage as the selected program step voltage is increased.

18. The method according to claim 16, wherein the determining of the pass voltage repetition value based on the determined program step voltage comprises:
reducing the determined pass voltage repetition value as the selected program step voltage is increased.

19. A control logic comprising:
a setting storage unit configured to store set values according to an address identifying a position of a selected word line;
a program voltage determination unit configured to determine a program step voltage to be applied to the selected word line based on the set values; and
a pass voltage determination unit configured to determine a pass voltage to be applied to unselected word lines based on the program step voltage,
wherein the program step voltage has a higher value than 0V.

20. The control logic according to claim 19,
wherein the position of the selected word line is based on a location of a memory cell included in a memory string amongst other memory cells included in the memory string.

* * * * *